United States Patent
Ng

(10) Patent No.: US 6,609,225 B1
(45) Date of Patent: Aug. 19, 2003

(54) METHOD AND APPARATUS FOR GENERATING AND CHECKING CYCLIC REDUNDANCY CODE (CRC) VALUES USING A MULTI-BYTE CRC GENERATOR ON A VARIABLE NUMBER OF BYTES

(75) Inventor: Yu Kwong Ng, Los Altos, CA (US)

(73) Assignee: Cisco Technology, Inc., San Jose, CA (US)

( * ) Notice: Subject to any disclaimer, the term of this patent is extended or adjusted under 35 U.S.C. 154(b) by 468 days.

(21) Appl. No.: 09/748,637

(22) Filed: Dec. 21, 2000

(51) Int. Cl.$^7$ ............................................... H03M 13/15
(52) U.S. Cl. ....................................................... 714/781
(58) Field of Search ................................. 714/781–785

(56) References Cited

U.S. PATENT DOCUMENTS

| | | | |
|---|---|---|---|
| 4,162,480 A | | 7/1979 | Berlekamp |
| 4,833,678 A | | 5/1989 | Cohen |
| 4,856,003 A | * | 8/1989 | Weng ......................... 714/784 |
| 5,282,214 A | * | 1/1994 | Dravida ....................... 714/757 |
| 5,398,284 A | * | 3/1995 | Koopman et al. ............ 380/28 |

FOREIGN PATENT DOCUMENTS

| | | | | |
|---|---|---|---|---|
| JP | 2000269826 A | * | 9/2000 | .......... H03M/13/23 |

OTHER PUBLICATIONS

Winn Schwartu, Wipe Out Web Graffiti By Going Back To Basics, Feb. 14, 2000, Network World, p. 59.*

* cited by examiner

*Primary Examiner*—R. Stephen Dildine
(74) *Attorney, Agent, or Firm*—The Law Office of Kirk D. Williams

(57) ABSTRACT

Methods and apparatus are disclosed for generating and checking CRC values using a multi-byte CRC generator on a variable number of bytes. These methods and apparatus could used in an unlimited number of applications and environments, such as part of computer or communications device (e.g., router or switch). A CRC generator is used to calculate a preliminary CRC value on a block of information. This CRC generator may be a balanced XOR tree or some other implementation, which calculates the preliminary CRC value on groups of n bytes of data at a time, where n is typically some value such as 2, 4, 8, 16, 32, 64 etc. For example, when data is transferred over a 512 wide bit bus, typically the value of n would be 64 (i.e., 512 bits divided by 8 bits per byte). Because the number of bytes in the data block may not be an even multiple of the value of n, one or more bytes of value zero may be appended to the data block to make it an even multiple, with the preliminary CRC calculated on the entire appended data block. A CRC checker may compare this preliminary CRC value with that of a target CRC value corresponding to the number of appended bytes of value zero. A reverse CRC generator may take as input the preliminary CRC value and the number of appended bytes of value zero to calculate the actual CRC value of the block of information. Additional implementations allow the first portion of the data block to include one or more prefix bytes of value zero to accommodate the position of a first byte of the block of information.

27 Claims, 12 Drawing Sheets

```
1-bit (forward) serial Ethernet CRC-32 calculation:
where DIN is a 1-bit input data
where FEEDBACK is a 1-bit variable
where current_CRC and prev_CRC are 32-bit variables FEEDBACK = DIN xor prev_CRC[31];

current_CRC[31] = prev_CRC[30];                      // equation 31
current_CRC[30] = prev_CRC[29];                      // equation 30
current_CRC[29] = prev_CRC[28];                      // equation 29
current_CRC[28] = prev_CRC[27];                      // equation 28
current_CRC[27] = prev_CRC[26];                      // equation 27
current_CRC[26] = FEEDBACK xor prev_CRC[25];         // equation 26
current_CRC[25] = prev_CRC[24];                      // equation 25
current_CRC[24] = prev_CRC[23];                      // equation 24
current_CRC[23] = FEEDBACK xor prev_CRC[22];         // equation 23
current_CRC[22] = FEEDBACK xor prev_CRC[21];         // equation 22
current_CRC[21] = prev_CRC[20];                      // equation 21
current_CRC[20] = prev_CRC[19];                      // equation 20
current_CRC[19] = prev_CRC[18];                      // equation 19
current_CRC[18] = prev_CRC[17];                      // equation 18
current_CRC[17] = prev_CRC[16];                      // equation 17
current_CRC[16] = FEEDBACK xor prev_CRC[15];         // equation 16
current_CRC[15] = prev_CRC[14];                      // equation 15
current_CRC[14] = prev_CRC[13];                      // equation 14
current_CRC[13] = prev_CRC[12];                      // equation 13
current_CRC[12] = FEEDBACK xor prev_CRC[11];         // equation 12
current_CRC[11] = FEEDBACK xor prev_CRC[10];         // equation 11
current_CRC[10] = FEEDBACK xor prev_CRC[9];          // equation 10
current_CRC[9]  = prev_CRC[8];                       // equation 9
current_CRC[8]  = FEEDBACK xor prev_CRC[7];          // equation 8
current_CRC[7]  = FEEDBACK xor prev_CRC[6];          // equation 7
current_CRC[6]  = prev_CRC[5];                       // equation 6
current_CRC[5]  = FEEDBACK xor prev_CRC[4];          // equation 5
current_CRC[4]  = FEEDBACK xor prev_CRC[3];          // equation 4
current_CRC[3]  = prev_CRC[2];                       // equation 3
current_CRC[2]  = FEEDBACK xor prev_CRC[1];          // equation 2
current_CRC[1]  = FEEDBACK xor prev_CRC[0];          // equation 1
current_CRC[0]  = FEEDBACK;                          // equation 0
```

FIGURE 5A

```
1-bit (reverse) serial Ethernet CRC-32 calculation:

The CRC values after we go backward n bits are :
where END_CRC is the CRC values at the last bit of the last word.
where current_CRC and prev_CRC are 32-bit variable.

current_CRC = END_CRC;
for ( k = 0; k < n; k = k + 1 )
{
    for ( i = 0; i < 32; i = i + 1 )
    {
        if ( i == 31 ) prev_CRC[31] = current_CRC[0];
        else if ( i == any of (0,1,3,4,6,7,9,10,11,15,21,22,25) ) prev_CRC[i] = current_CRC[i+1] xor current_CRC[0];
        else if ( i == any of (2,5,8,12,13,14,16,17,18,19,20,23,24,26,27,28,29,30) ) prev_CRC[j] = current_CRC[j+1];
    }
    current_CRC = prev_CRC;
}
```

FIGURE 5B

ACRC[31] = (MASK[31,31] · PCRC[31]) XOR (MASK[31,30] · PCRC[30]) XOR ... (MASK[31,0] · PCRC[0])
ACRC[30] = (MASK[30,31] · PCRC[31]) XOR (MASK[30,30] · PCRC[30]) XOR ... (MASK[30,0] · PCRC[0])
ACRC[29] = (MASK[29,31] · PCRC[31]) XOR (MASK[29,30] · PCRC[30]) XOR ... (MASK[29,0] · PCRC[0])
.
.
.
ACRC[0] = (MASK[0,31] · PCRC[31]) XOR (MASK[0,30] · PCRC[30]) XOR ... (MASK[0,0] · PCRC[0])

```
case( last_word_position )
  5'd1:  mask[0,31:0] <= 32'b00101010011001010101011100010010;
  5'd2:  mask[0,31:0] <= 32'b00010011100101010011001110001110;
  5'd3:  mask[0,31:0] <= 32'b10001001100100100101010101100110;
  5'd4:  mask[0,31:0] <= 32'b01101001100010110100010011001010;
  5'd5:  mask[0,31:0] <= 32'b11001110010101100111000100100111;
  5'd6:  mask[0,31:0] <= 32'b11001100011100110010010110001001;
  5'd7:  mask[0,31:0] <= 32'b10111100011001100011110011001001;
  5'd8:  mask[0,31:0] <= 32'b01100011101100011000110111001110;
  5'd9:  mask[0,31:0] <= 32'b10011001101111001110101110001001;
  5'd10: mask[0,31:0] <= 32'b01110011001110001000011000111000;
  5'd11: mask[0,31:0] <= 32'b00110010001100011100011000100011;
  5'd12: mask[0,31:0] <= 32'b00011100100011010110111001101100;
  5'd13: mask[0,31:0] <= 32'b00010011001010001001101110110011;
  5'd14: mask[0,31:0] <= 32'b01111001001000110000101001010100;
  5'd15: mask[0,31:0] <= 32'b10110011001101110100100100110010;
  5'd16: mask[0,31:0] <= 32'b01010110011001100000010000010010;
  5'd17: mask[0,31:0] <= 32'b01011010010000010111001001011100;
  5'd18: mask[0,31:0] <= 32'b00100000001010010011001011100110;
  5'd19: mask[0,31:0] <= 32'b10111001010110101001000101010100;
  5'd20: mask[0,31:0] <= 32'b10011010000000001010010001101010;
  5'd21: mask[0,31:0] <= 32'b01001110110010111010101001000000;
  5'd22: mask[0,31:0] <= 32'b11110010101101101001110101011001;
  5'd23: mask[0,31:0] <= 32'b00111101001001110011100110111010;
  5'd24: mask[0,31:0] <= 32'b00010010010101011111001010101110;
  5'd25: mask[0,31:0] <= 32'b11110001001010101111111000101010;
  5'd26: mask[0,31:0] <= 32'b00010010100010011001010111111111;
  5'd27: mask[0,31:0] <= 32'b10111000101000100000100011111111;
  5'd28: mask[0,31:0] <= 32'b10111010101010001010100100100110;
  5'd29: mask[0,31:0] <= 32'b10000000101010010101000101000010;
  5'd30: mask[0,31:0] <= 32'b00000000000000000010101010101010;
  5'd31: mask[0,31:0] <= 32'b00000000000000000000010000010001;
  default: mask[0,31:0] <= 32'b00000000000000000000000000000001;
endcase
end
```

FIGURE 6B

METHOD AND APPARATUS FOR GENERATING AND CHECKING CYCLIC REDUNDANCY CODE (CRC) VALUES USING A MULTI-BYTE CRC GENERATOR ON A VARIABLE NUMBER OF BYTES

FIELD OF THE INVENTION

The invention relates to error detection in communication between components and systems; more particular, the invention relates to generating and checking cyclic redundancy code (CRC) values using a multi-byte CRC generator on a variable number of bytes.

BACKGROUND OF THE INVENTION

Devices such as computers, routers, networking equipment, and components thereof communicate information internally and/or with other devices. For example, computers might communicate across a local area network (LAN) using Ethernet protocol, or application-specific integrated circuits (ASICs) may communicate with each other over a single or parallel bit bus. It is important for these devices to reliably communicate and to detect errors in their communication.

One common technique for detecting transmission errors is a technique known as the cyclic redundancy check (CRC). A CRC allows the detection of errors using only a small number of redundant bits typically sent along with the communicated information. For example, a 32-bit CRC gives strong protection against common bit errors in messages that are thousands of bits long. Ethernet, a common link-level protocol, uses a frame format that includes CRC-32, a specific 32-bit CRC having the polynomial of:

$$CRC\text{-}32{:}P(x)=x^{26}+x^{23}+x^{22}+x^{16}+x^{16}+x^{12}+x^{11}+x^{10}+x^{8}+x^{7}+x^{5}+x^{4}+x^{2}+x+1$$

One common method for computation of a CRC operates serially on each bit of a message using a shift register and XOR gates, where the number of bits in the shift register equals the degree of the CRC generating polynomial. The value of the CRC is determined by calculating the CRC from the first byte of the frame and stops calculating the CRC at the last byte. During transmission, this CRC is usually appended to the end of the frame. The receiver of the frame then calculates the CRC on the frame it receives, and compares the calculated CRC to the data source generated CRC that was appended to the end of the frame. If they match, the frame has a good CRC; otherwise, the frame is corrupted and is typically discarded. This serial approach for determining a CRC may be sufficient for certain applications. However, especially at higher operating rates, the serial determination of a CRC may be too slow or may limit the effective communication rate between devices or components.

One approach to increase the rate for determining a CRC is to process several bytes in parallel, such as using a balanced XOR tree. However, a balanced XOR tree suffers from the inability to adjust to a variable number of bytes on which to determine a CRC. For example, Ethernet frames are of variable length from sixty-four bytes to 1518 bytes. Thus, a high-speed device, such as a switch, transmitting Ethernet frames needs to accommodate the calculation of a CRC on frames of varying lengths. For example, if sixty-four bytes are operated on in parallel, then there are sixty-four possibilities where the last byte can be located.

One costly approach to accommodate variable length data frames is to implement multiple, independent balanced XOR trees for each possible data length and then to select between the results. For example, determining a CRC in parallel on blocks of sixty-four bytes would require sixty-four balanced XOR trees and then selecting between the results based on the data length (e.g., the position of the last byte of data in the block of sixty-four bytes). Some deficiencies in this approach include a timing delay due to multiplexing the results, particularly as the number of bytes operated on in parallel becomes large. Additionally, implementing such a large number of XOR trees is costly (e.g., if would require a lot of gates and silicon area in an ASIC).

The number of gates and space requirements can be reduced by using ripple XOR trees of various byte widths with multiplexing to send the output of one to the input of the next appropriate XOR tree. One approach is to implement binary multiples (e.g., 1, 2, 4, 8, etc.) of input data width. However, this approach still entails significant time delays and a limited performance.

Needed is a new way of generating CRC values using a multi-byte CRC generator on a variable number of bytes.

SUMMARY OF THE INVENTION

A device determines a cyclic redundancy check (CRC) on a block of information. A preliminary CRC on the block of information plus at least one additional byte of information is first determined. Then, the CRC is determined through a reverse CRC operation on the preliminary CRC.

BRIEF DESCRIPTION OF THE DRAWINGS

The appended claims set forth the features of the invention with particularity. The invention, together with its advantages, may be best understood from the following detailed description taken in conjunction with the accompanying drawings of which:

FIG. 5A is a diagram including equations of one approach for determining a serial forward CRC;

FIG. 5B is a diagram including equations of one approach for determining a reverse CRC;

FIG. 6B is a portion of the data used in conjunction with the equations illustrated in FIG. 6A for determining a reverse CRC from a calculated CRC.

DETAILED DESCRIPTION

Figure 1A:
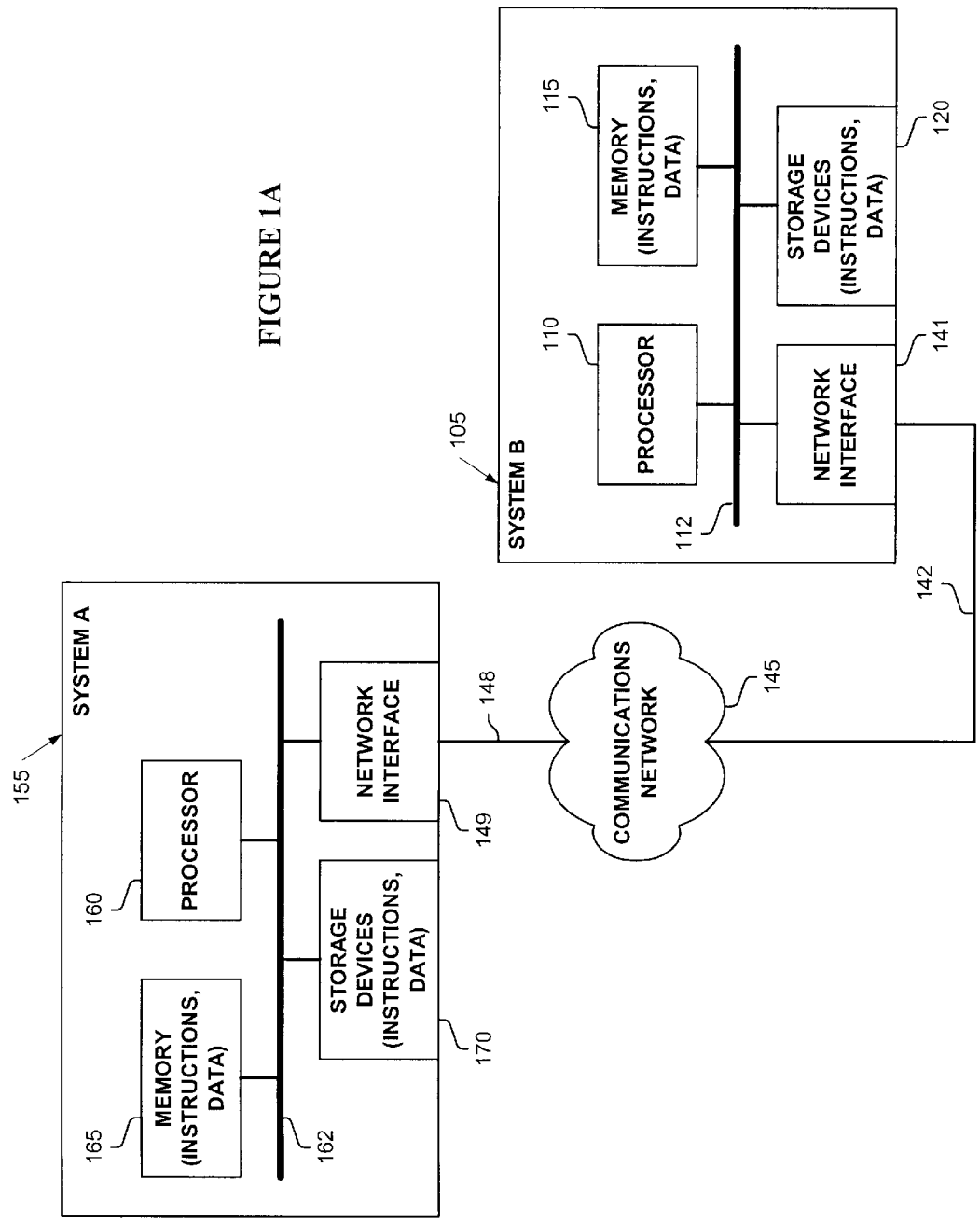
FIG. 1A is a block diagram of an exemplary embodiment and operating environment.

Methods and apparatus are disclosed for generating and checking CRC values using a multi-byte CRC generator on a variable number of bytes. Although embodiments are described herein for simplicity of illustration with reference to CRC-32 and its defined polynomial, the invention is not limited to CRC-32 nor any other CRC polynomial equation. Rather, the invention is extensible to, and includes an unlimited number of CRC polynomial equations. Moreover, the methods and apparatus disclosed herein in accordance with the invention are not limited to a single computer, computing platform, operating system, router, or communications architecture, etc. Rather, the architecture and functionality taught herein are extensible to an unlimited number of systems, devices and embodiments in keeping with the scope and spirit of the invention. Embodiments described herein include various elements and limitations, with no one element or limitation contemplated as being a critical element or limitation. Each of the claims individually recite an aspect of the invention in its entirety. Moreover, some embodiments described may include, inter alia, systems, devices, methods, and computer-readable medium containing instructions. The embodiments described herein embody various aspects and configurations within the scope and spirit of the invention.

As used herein, the term "system" is used generically herein to describe any number of devices, computers, routers, networks, computer and/or communication devices or mechanisms, or combinations thereof. The term "computer" is used generically herein to describe any number of computers, including, but not limited to personal computers, embedded processors, ASICs, chips, workstations, mainframes, etc. The term "device" is used generically herein to describe any type of mechanism, including a computer or system or component thereof. The term "process" is used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating address spaces, a routine of a library and/or standalone application, and is not limited to any particular memory partitioning technique.

Methods and apparatus are disclosed for generating and checking CRC values using a multi-byte CRC generator on a variable number of bytes. These methods and apparatus could used in an unlimited number of applications and environments, such as part of computer or communications device (e.g., router or switch). A CRC generator is used to calculate a preliminary CRC value on a block of information. This CRC generator may be a balanced XOR tree or some other implementation, which calculates the preliminary CRC value on groups of n bytes of data at a time, where n is some value such as 2, 4, 8, 16, 32, 64 etc. For example, when data is transferred over a 512 wide bit bus, typically the value of n would be 64 (i.e., 512 bits divided by 8 bits per byte). Because the number of bytes in the data block may not be an even multiple of the value of n, one or more bytes of value zero may be appended to the data block to make it an even multiple, with the preliminary CRC calculated on the entire appended data block. A CRC checker may compare this preliminary CRC value with that of a target CRC value corresponding to the number of appended bytes of value zero. A reverse CRC generator may take as input the preliminary CRC value and the number of appended bytes of value zero to calculate the actual CRC value of the block of information. Additional embodiments allow the first portion of the data block to include one or more prefix bytes of value zero to accommodate the position of a first byte of the block of information.

FIG. 1A illustrates an exemplary embodiment and operating environment of the invention. As shown, System A 155 is communicating over communications network 145 and links 142 and 148 with System B 105, wherein System A 155 and System B 105 include an embodiment of the invention for generating and/or checking CRC values using a multi-byte CRC generator on a variable number of bytes. In one embodiment, System A 155 communications with System B 105 using Ethernet or some other protocol(s), and using a CRC, such as, but not limited to, CRC-8, CRC-10, CRC-12, CRC-16, CRC-CCITT, CRC-32, or some other CRC polynomial to detect errors. Various embodiments of System A 155 and/or System B 105 include, but are not limited to, an interface component (e.g., a network card) of a larger system such as a computer, switch, router or other device, with System A 155 and System B 105 be a part of the same or different devices. The CRC may be generated by processor 110 and/or 160, and/or within network interface 141 and/or 149.

In an embodiment, System B 105 comprises a processor 110, memory 115, storage devices 120, and a network interface 141, which are electrically coupled via one or more communications mechanisms 112 (shown as a bus for illustrative purposes.) Network interface 141 is connected to a communications network 145 (e.g., one or more networks, including, but not limited to the Internet, private or public telephone, cellular, wireless, satellite, cable, local area, metropolitan area and/or wide area networks, or an internal communications mechanism) over connection 142. Memory 115 is one type of computer-readable medium, and typically comprises random access memory (RAM), read only memory (ROM), integrated circuits, and/or other memory components. Memory 115 typically stores computer-executable instructions to be executed by processor 110 and/or data which is manipulated by processor 110 for implementing functionality in accordance with the present invention. Storage devices 120 are another type of computer-readable medium, and typically comprise disk drives, diskettes, networked services, tape drives, and other storage devices. Storage devices 120 typically store computer-executable instructions to be executed by processor 110 and/or data which is manipulated by processor 110 for implementing functionality in accordance with the present invention. System B 105 may only include some of the elements 110, 115, and 120, and/or use different elements to provided the functionality described herein.

As used herein and contemplated by the present invention, computer-readable medium is not limited to memory and storage devices; rather computer-readable medium is an extensible term including other storage and signaling mechanisms including interfaces and devices such as network interface cards and buffers therein, as well as any communications devices and signals received and transmitted, and other current and evolving technologies that a computerized system can interpret, receive, and/or transmit.

In an embodiment, System A 155 comprises a processor 160, memory 165, storage devices 170, and a network interface 149, which are electrically coupled via one or more communications mechanisms 162 (shown as a bus for illustrative purposes.) Network interface 149 is connected to a communications network 145 (e.g., one or more networks, including, but not limited to the Internet, private or public telephone, cellular, wireless, satellite, cable, local area, metropolitan area and/or wide area networks, or an internal communications mechanism) over connection 148. Memory 165 is one type of computer-readable medium, and typically comprises random access memory (RAM), read only memory (ROM), integrated circuits, and/or other memory components. Memory 165 typically stores computer-executable instructions to be executed by processor 160 and/or data which is manipulated by processor 160 for implementing functionality in accordance with the present invention. Storage devices 170 are another type of computer-readable medium, and typically comprise disk drives, diskettes, networked services, tape drives, and other storage devices. Storage devices 170 typically store computer-executable instructions to be executed by processor 160 and/or data which is manipulated by processor 160 for implementing functionality in accordance with the present invention. System A 155 may only include some of the elements 160, 165, and 170, and/or use different elements to provided the functionality described herein.

Additionally, System A 155, System B 105 and communications network 145 may be implemented as part of a single computer or network device, with communications network 145 being a data bus or some other internal information sharing mechanism such as message passing or shared memory.

Figure 1B:
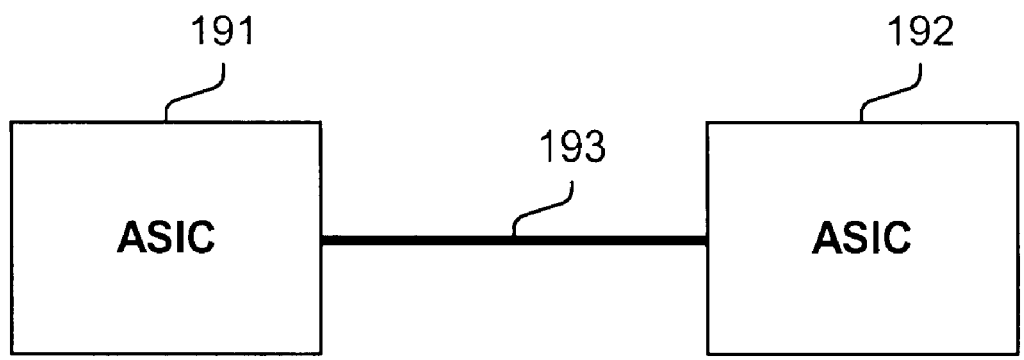
FIG. 1B is a block diagram of an embodiment including two components (e.g., ASICs) communicating over a link or bus.

FIG. 1B illustrates another embodiment where two ASICs 191 and 192 are communication over a bus 193. ASICs 191 and 192 implement the functionality of the invention to generate and/or check CRC values of communicated information.

Figure 2A:
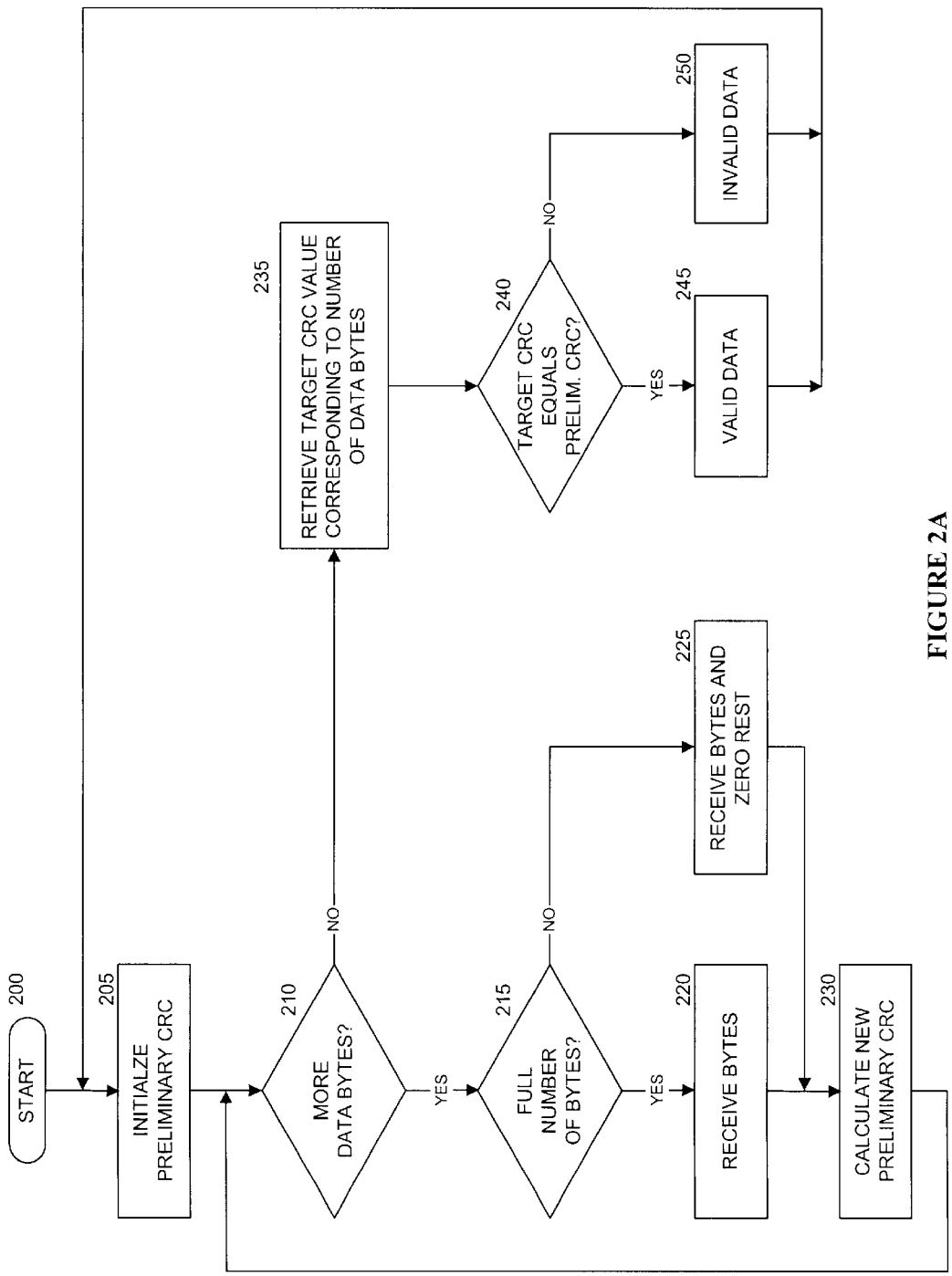
FIG. 2A is a flow diagram for determining and checking a CRC.

FIG. 2A illustrates one embodiment for computing and checking a CRC value of a block of information by progressively determining preliminary CRC values on groups of a predetermined number of bytes comprising the block of information. Processing begins at process block 200 and proceeds to process block 205 wherein the value of the CRC is initialized. In one embodiment, the value of the CRC is initialized to all ones. In one embodiment, the first byte of the block of information can be located anywhere within the predetermined number of bytes. Thus, the CRC must be initialized to some value to accommodate this variable starting position. The processing for determining this is described in the flow diagram of FIG. 3, to which we now turn.

Figure 3:
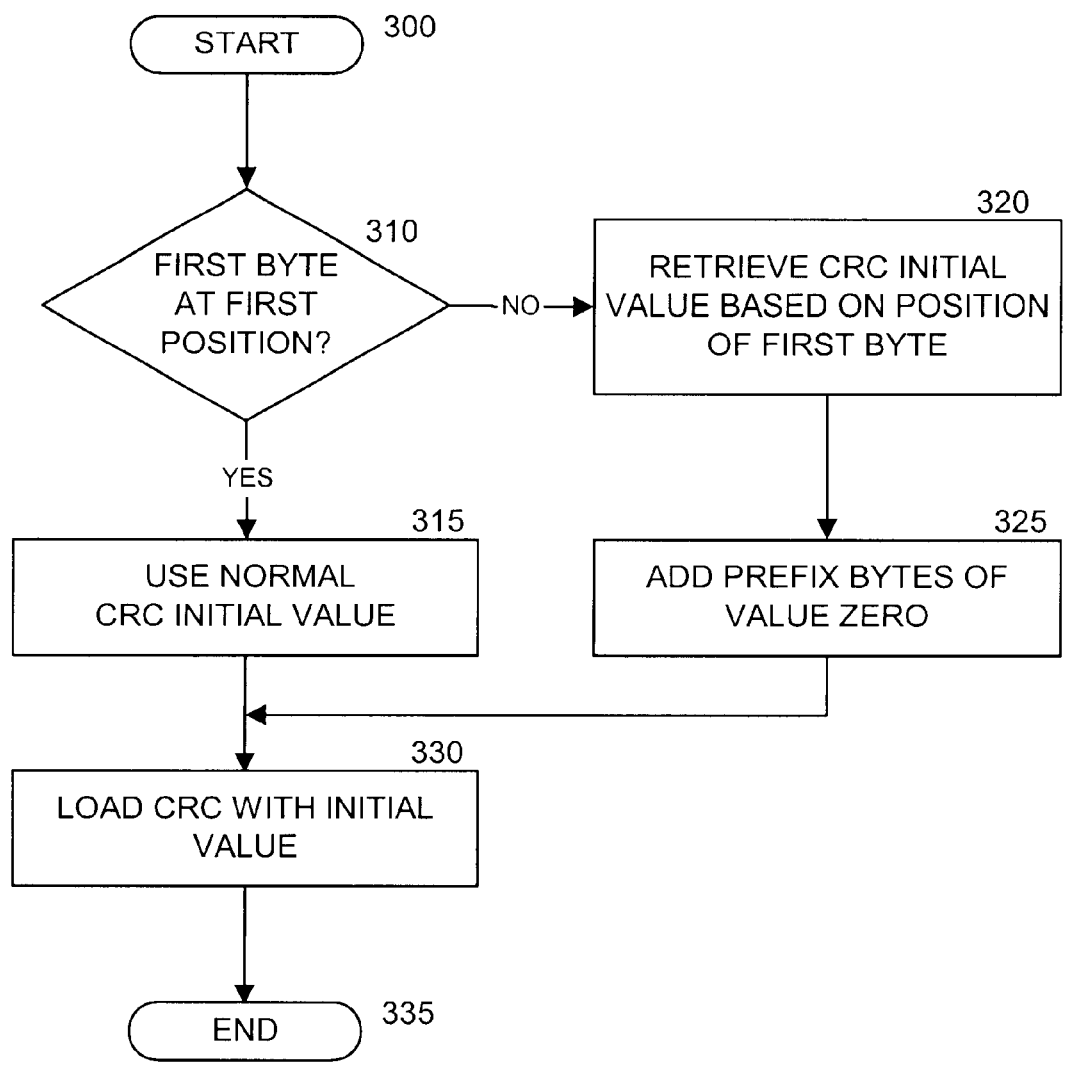
FIG. 3 is a flow diagram for accommodating a variable starting position of a first byte of the data in determining and checking a CRC.

Processing begins at process block 300. If the first byte of the block of information is located in the first position of the predetermined number of bytes as determined in process block 310, then the preliminary CRC is will be set to a normal CRC initial value (e.g., all ones) as indicated by process block 315. Otherwise, in process block 320, the preliminary CRC will be set to a predetermined value corresponding to the position of the first byte of the block of information within the predetermined number of bytes. In one embodiment, the possible predetermined values are stored in and retrieved from a lookup table. Next, in process block 325, prefix bytes of value zero are added to supplement the first set of information bytes on which to determine the CRC. In this manner, by the time the CRC calculation goes through all the prefix bytes of value zero, the preliminary CRC will have been effectively set to the normal CRC initial value (e.g., all ones) as required to determine the correct CRC. The values for this lookup table can be calculated ahead of time using the cyclic nature or commutive property of the CRC function. For example, a CRC value can be calculated such that when loaded into a CRC generator, at times corresponding to 8, 16, 32, etc. bits of value shifted in, the resulting CRC value of all ones is produced. The communitive nature of a CRC function is described hereinafter in relation to FIGS. 5A–B. Processing then proceeds to process block 330 wherein the determined value is loaded into the preliminary CRC, and processing of the flow diagram of FIG. 3 is completed as indicated by process block 335.

Returning to FIG. 2A, if there are more bytes of the block of information to process in computing the preliminary CRC as determined in process block 210, then if there are enough bytes of information to fill the predetermined number of bytes used by the CRC generator as determined in process block 215, then the CRC will be calculated on the received bytes as indicated in process block 220. Otherwise, the CRC will be calculated on the received bytes with the remainder of the bytes in the predetermined number of bytes set to zero as indicated by process block 225. Then in process block 230, the new preliminary CRC is calculated, and processing returns to process block 210.

When there are no more data bytes to receive as determined in process block 210, then, in process block 235, a target CRC value is retrieved which corresponds to the number of zero bytes appended to the block of information. One embodiment for determining the values in the lookup table are described hereinafter in relation to FIG. 2C. If the target CRC value equals the calculated preliminary CRC as determined in process block 240, then the information is valid as indicated by process block 245, otherwise the information is invalid as indicated by process block 250. Processing then returns to process block 205 to process more blocks of information.

Figure 2B:
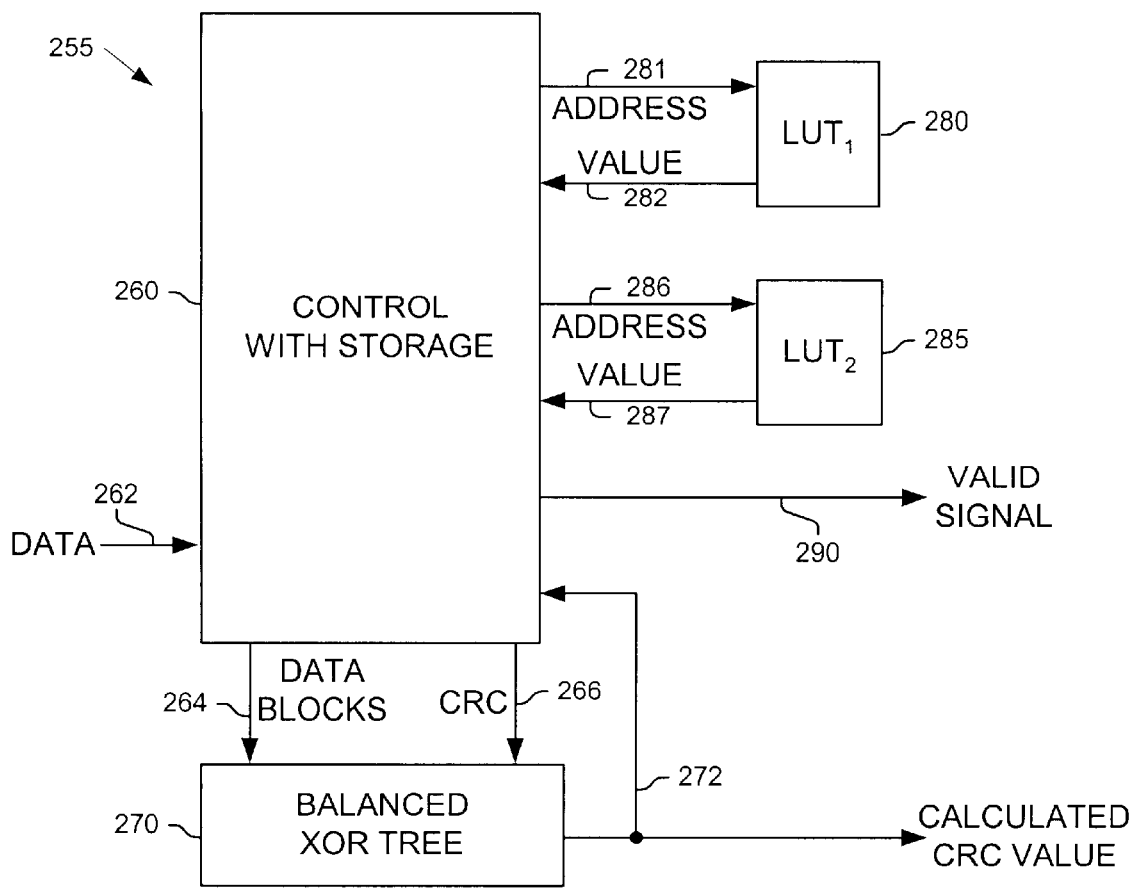
FIG. 2B is a block diagram of an embodiment including a circuit for determining and checking a CRC.

System 255 illustrated in FIG. 2B illustrates one of numerous embodiments for checking a CRC. Some embodiments illustrated in FIG. 2B implement the process described in relation to FIG. 2A, including embodiments with and without the variable first byte position of the data block feature described in relation to FIG. 3.

In one embodiment, control with storage 260 buffers the block of information received over data link 262. Control with storage 260 then communicates portions of the block of information in n byte segments over data bus 264 and a current value of the preliminary CRC over data link 266 to balanced XOR tree 270 to determine the new preliminary CRC. The initial value of the CRC is typically either all ones, or a predetermined value retrieved over link 282 from lookup table one 280 based on the position of the first byte of the block of information on data bus 264 (as described in relation to FIG. 3). An address 281 corresponding to the position of the first byte of the block of information is supplied to lookup table one 280 to produce value 282. Control with storage 260 then receives the new preliminary CRC value over data link 272 and repeats this process until there is no more data bytes remaining to process. If the last portion of data bytes does not fill the entire width of bus 264, then the remaining bytes of data bus 264 are set to zero.

When the preliminary CRC has been determined on the block of information plus possibly at least one appended byte of value zero, then a target CRC value is retrieved from lookup table two 285 over data path 287 by sending an address corresponding to the number of zero bytes appended to the block of information over address link 286 to lookup table two 285. The target CRC values can be predetermined for each of the possible number of zero bytes appended to the block of information by simple CRC calculations as the CRC calculation of the expected constant plus one or more zero bytes is just another constant.

If the preliminary CRC value is the same as the retrieved target CRC value, signal 290 is set to indicate a valid CRC, otherwise signal 290 is set to indicate an invalid CRC. The calculated preliminary CRC may be made available to other components or devices over data path 272. This process repeats to check a plurality of blocks of information (e.g., data packets).

Figure 2C:
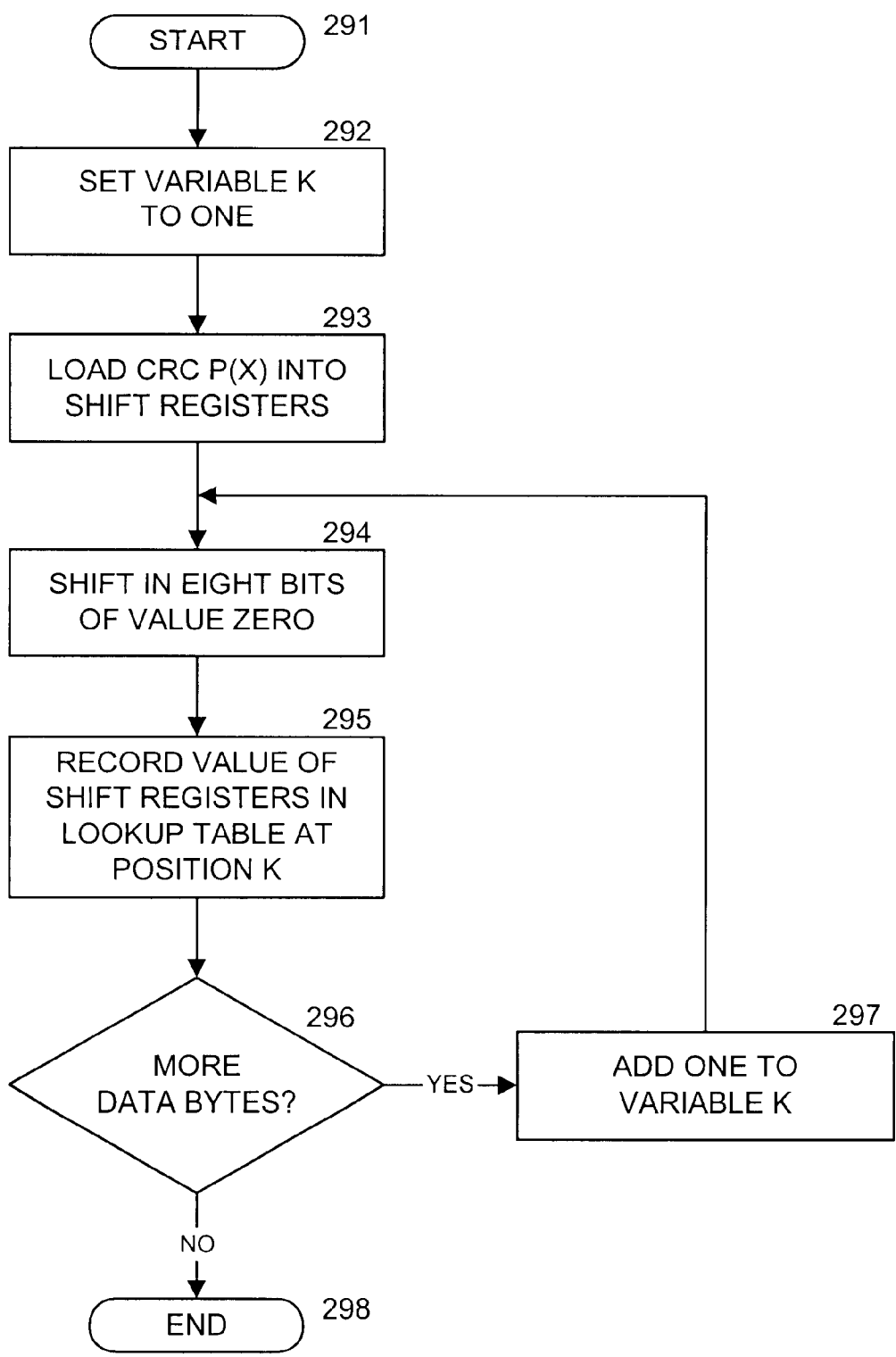
FIG. 2C is a flow diagram for determining the values stored in a lookup table for a variable ending position of a block of information on which a CRC is to be determined.

FIG. 2C describes one embodiment for determining the values required for lookup table two 285 and for process block 235 (FIG. 2A). The process described in FIG. 2C assumes a conventional shift register configuration for determining a CRC. However, as apparent to one skilled in the art, the process describe in relation to FIG. 2C could also be performed in software or another hardware configuration. Processing begins at process block 291 and proceeds to process block 292 where a variable k is set to one. The value of k corresponds to a prefix number of bytes of value zero before the first byte of information. Next, in process block 293, the value of the CRC polynomial is loaded into a conventional set of shift registers configured to determine the CRC. In process block 294, the eight bits (one byte) of value zero are used as input to the CRC generator. Next, in process block 295, the generated CRC value is recorded in the lookup table at position k. If there are more possible byte positions as determined in process block 296, then k is incremented in process block 297 and processing returns to process block 294 to calculate more values for the lookup table. Otherwise, processing is completed as indicated by process block 298.

Figure 4A:
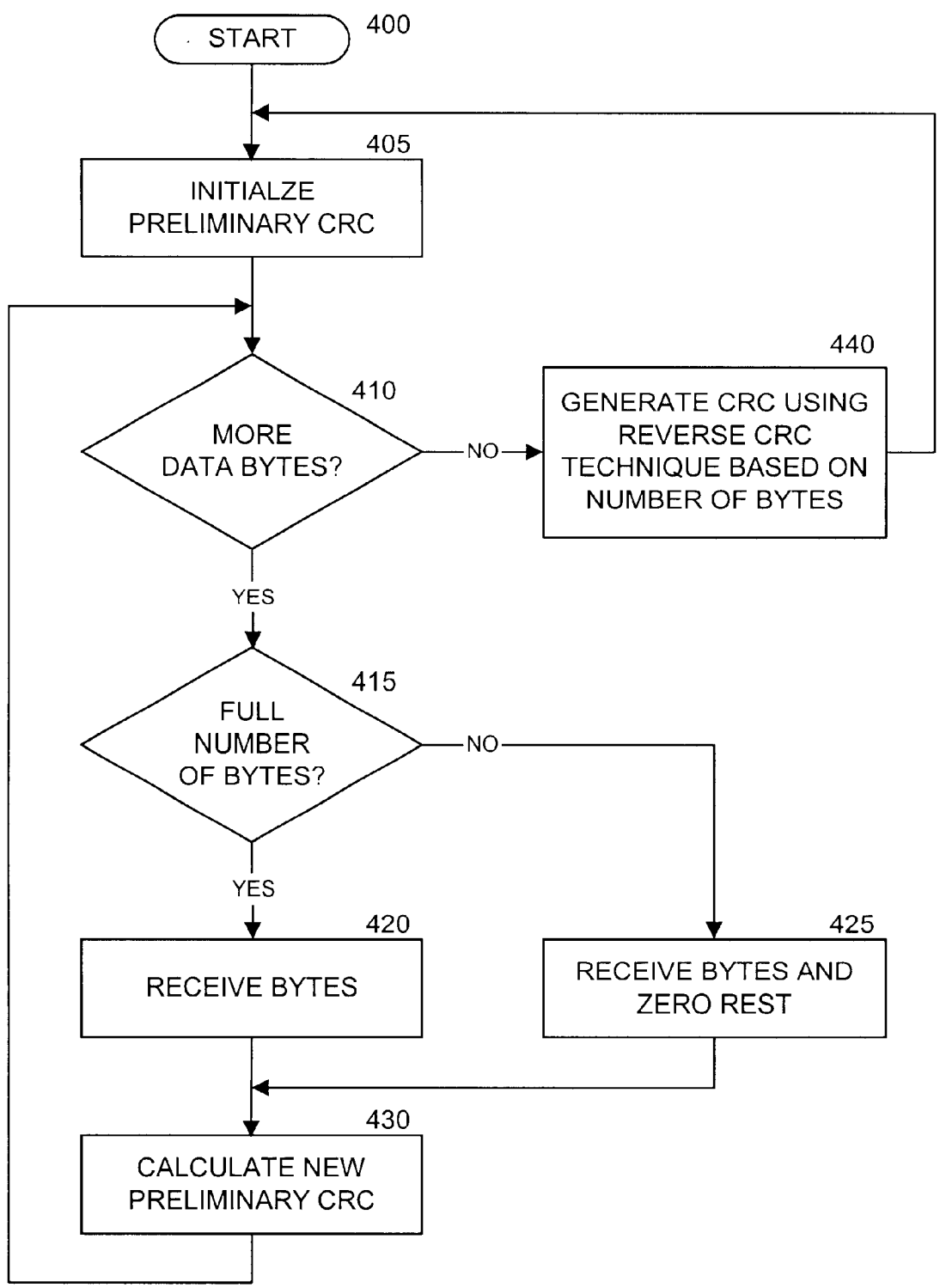
FIG. 4A is a flow diagram for determining a CRC for a variable ending position of a last byte of data using a reverse CRC generator.

FIG. 4A illustrates one embodiment for generating a CRC value using a multi-byte CRC generator on a variable number of bytes by appending zero bytes to pad the multi-byte CRC generator as described in relation to FIGS. 2A–B, and then using a reverse CRC generator to counter the effect of the appended bytes of value zero. Processing begins at process block 400 and proceeds to process block 405 wherein the value of the CRC is initialized. In one embodiment, the value of the CRC is initialized to all ones. However, another embodiment includes provides for allowing the initial set of bytes to be located anywhere within the predetermined number of bytes. This processing was previously described herein in relation to the flow diagram of FIG. 3.

Next, if there are more bytes of the block of information to process in computing the preliminary CRC as determined in process block 410, then if there are enough bytes of information to fill the predetermined number of bytes used by the CRC generator as determined in process block 415, then the CRC will be calculated on the received bytes as indicated in process block 420. Otherwise, the CRC will be calculated on the received bytes with the remainder of the bytes set to zero as indicated by process block 425. Then in process block 430, the new preliminary CRC is calculated, and processing returns to process block 410.

When there are no more data bytes to receive as determined in process block 410, then, in process block 440, the actual CRC value for the block of information is generated using a reverse CRC technique based on the number of zero bytes appended to the block of information on which the preliminary CRC was calculated. Processing then returns to process block 405 to process more blocks of information.

The reverse CRC generator technique determines the actual CRC on a data block from a preliminary CRC calculated on the data block plus one or more bytes of value zero. The fundamental computation involved in determining a CRC is the XOR function. Because a known number of bytes of a known value (e.g., zero) have been appended to the block of information, it is possible to reverse the CRC calculation process to determine the actual. CRC on a data block from a preliminary CRC calculated on the data block plus one or more bytes of value zero.

FIG. 5A list some equations for serially determining a new thirty-two bit current_CRC[0–31] CRC-32 value based on the previous thirty-two bit prev_CRC[0–31] plus the value of the next data bit being shifted in (DIN). A forward CRC generator is able to calculate a next CRC value with a DIN value. Because of the communitive nature of these equations, it is possible to determine equations for a reverse CRC generator with a known DIN value.

For example, according to equation zero of FIG. 5A,
    current_CRC[0]=FEEDBACK=DIN xor prev_CRC[31]
Thus, prev_CRC[31]=DIN xor current_CRC[0].
According to equation one,
    current_CRC[1]=FEEDBACK xor prev_CRC[0]
      =DIN xor prev_CRC[31] xor prev_CRC[0]
Thus, prev_CRC[0]=current_CRC[1] xor DIN xor prev_CRC[31]
    =current_CRC[1] xor DIN xor DIN xor current_CRC[0]
    =current_CRC[1] xor current_CRC[0].

In this manner, the equations of FIG. 5A for a forward CRC generator can be manipulated to produce a set of equations for a reverse CRC generator. A resultant script for a reverse CRC generator when DIN equal zero is illustrated in FIG. 5B. When DIN equals zero, the equations illustrated in FIG. 5A are simplified, and the case statement in FIG. 5B represents this simplification, as well as solving for a previous CRC ("prev_CRC") based on a current value of a CRC ("current_CRC"). Note, the value in the brackets indicates a bit position or range of bit positions. After the script has been executed for n bits, the value of the resultant CRC (i.e., current_CRC) can be obtained solely from the original value of the CRC (i.e., END_CRC). For every eight values of n (i.e., 0, 8, 16, 24, 32, . . . ), the resulting coefficients are recorded in lookup table 480 (FIG. 4B).

Figure 4B:
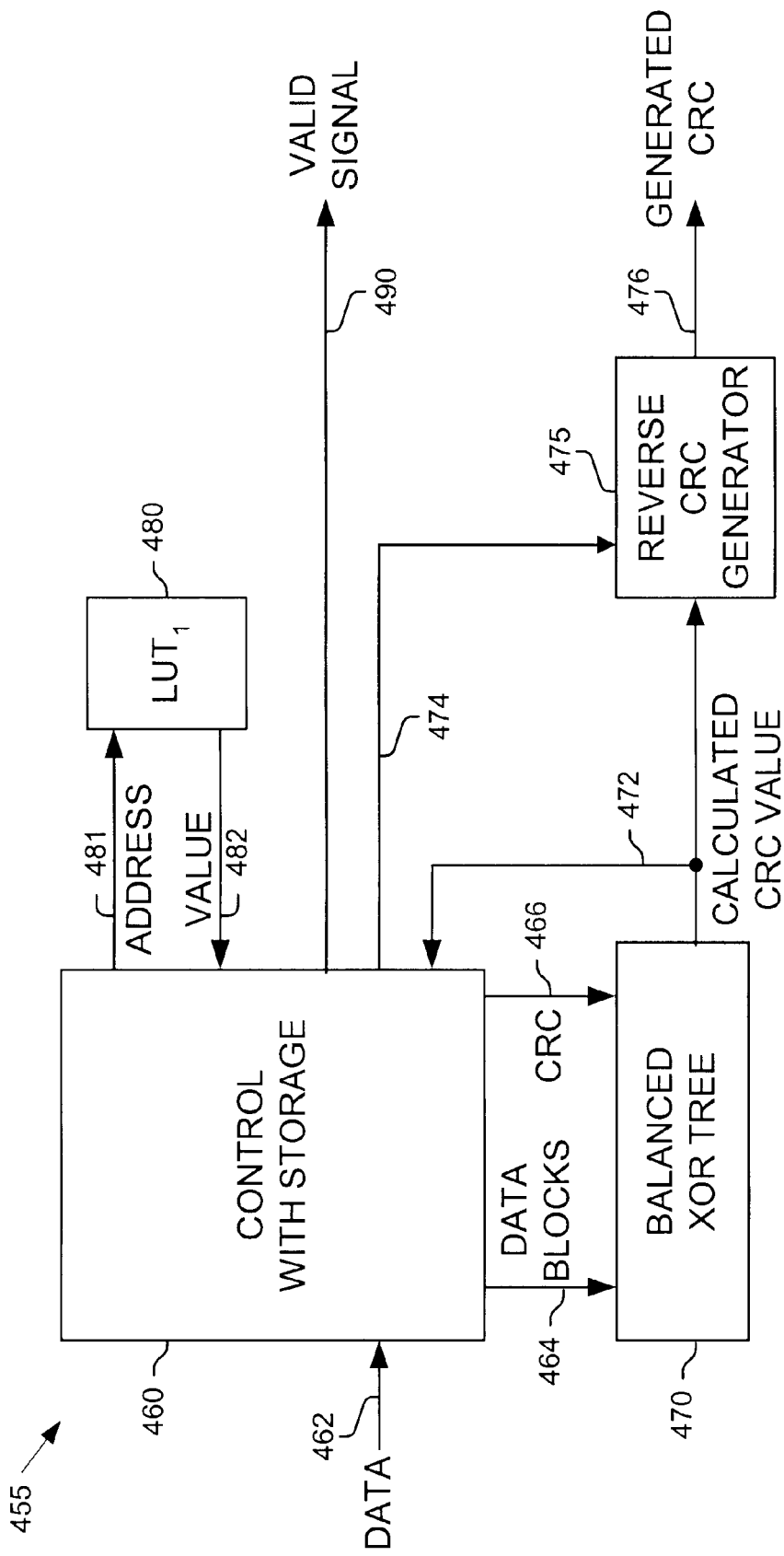
FIG. 4B is a block diagram of an embodiment including a circuit for determining a CRC for a variable ending position of a last byte of data using a reverse CRC generator.

System 455 illustrated in FIG. 4B illustrates one of numerous embodiments for determining a CRC on a variable length data block using a multi-byte balanced XOR tree 470 and a reverse CRC generator 475. Some embodiments illustrated in FIG. 4B implement the process described in relation to FIG. 4A, including embodiments with and without the variable first byte position of the data block feature described in relation to FIG. 3.

In one embodiment, control with storage 460 buffers the block of information received over data link 464. Control with storage 460 then communicates portions of the block of information in n byte segments over data bus 464 and a current value of the preliminary CRC over data link 466 to balanced XOR tree 470 to determine the new preliminary CRC. The initial value of the CRC is typically either all ones, or a predetermined value retrieved over bus 482 from lookup table 480 based on a supplied address 481 corresponding to the position of the first byte of the block of information on data bus 464 (as described in relation to FIG. 3).

Control with storage 460 then proceeds to determine the CRC on the blocks of information. Control with storage 460 receives newly calculated preliminary CRC values over data link 472 and repeats this process until there is no more data bytes remaining to process. If the last portion of data bytes does not fill the entire width of bus 464, then the remaining bytes of data bus 464 are set to zero.

When the preliminary CRC has been determined on the block of information plus possibly one or more appended bytes of value zero, then reverse CRC generator 475 determines, using the reverse CRC process described herein, the actual CRC for the block of information. The generated CRC is then made available to other components or systems over link 476, and a valid signal 490 is generated to indicate that the CRC determination is completed.

Figure 6A:
FIG. 6A is a diagram including equations for one approach for determining a reverse CRC from a calculated CRC.

Many embodiments of reverse CRC generator 475 are possible. In one embodiment illustrated in FIGS. 6A–B, a set of masking equations 600 are used to determine the actual CRC (ACRC) from the previously calculated preliminary CRC (PCRC). As previously described, the equation for calculating the actual CRC is determined by the number of zero bytes appended to the block of information which were included in the determination of the preliminary CRC. As illustrated, these masking equations 600 provide for each bit of the actual CRC to be a function of each bit of the preliminary CRC. The masking values can be pre-computed and stored in a table (such as lookup table 480 of FIG. 4B) and communicated to the reverse CRC generator (such as over signal link 474 of FIG. 4B). For one embodiment, the size of the masking table will be m by 32 by one bit, where m is the number of possible zero bytes appended to the block of information. For example, m is 32 in FIG. 6A, which corresponds to possibly adding 31 bytes of value zero, and a data bus of width 256 (32 times 8). FIG. 6B illustrates a portion of a masking table for one embodiment. For example, mask 6008 represents the masking value for n=8 (i.e., one appended byte), mask 6016 represents the masking value for n=16 (i.e., two appended bytes), mask 6024 represents the masking value for n=24 (i.e., three appended bytes), mask 6248 represents the masking value for n=248 (i.e., thirty-two appended bytes), and default mask 6000 represents the value for n=0 (i.e., no appended bytes). One embodiment simplifies the equations embodied in the masking tables using standard equation simplification techniques, which then may use a smaller and/or simplified circuit to implement the reverse CRC generator.

For simplicity of understanding, some embodiments have been described herein using one type of data structures and/or elements. As is apparent to one skilled in the art, numerous other embodiments are possible which use one or more of a wide variety of data structures and elements in keeping with the scope and spirit of the invention.

In view of the many possible embodiments to which the principles of our invention may be applied, it will be appreciated that the embodiments and aspects thereof described herein with respect to the drawings/figures are only illustrative and should not be taken as limiting the scope of the invention. To the contrary, the invention as described herein contemplates all such embodiments as may come within the scope of the following claims and equivalents thereof.

What is claimed is:

1. A method for determining a cyclic redundancy check (CRC) on a block of information, the method comprising:
   determining a preliminary CRC on the block of information plus at least one additional byte of information; and
   determining the CRC by a reverse CRC operation on the preliminary CRC.

2. The method of claim 1, wherein determining the CRC by the reverse CRC operation on the preliminary CRC includes selecting circuitry or a set of equations based on the number of bytes in the at least one additional byte of information.

3. The method of claim 1, wherein determining the preliminary CRC on the block of information plus at least one additional byte of information includes selecting a preliminary value based on a position of a first byte of the block of information.

4. The method of claim 1, further comprising receiving the block of information.

5. The method of claim 1, wherein the preliminary CRC and the CRC are both CRC-32 cyclic redundancy codes.

6. The method of claim 1, wherein the block of information includes a packet of information.

7. The method of claim 5, wherein the packet of information is includes the fields of an Ethernet packet.

8. A circuit performing the method of claim 1.

9. An application-specific integrated circuit (ASIC) performing the method of claim 1.

10. A router performing the method of claim 1.

11. A computer system for performing the method of claim 1.

12. A computer-readable medium containing computer-executable instructions for performing the method of claim 1.

13. The method of claim 1, wherein the block of information includes a plurality of sets of bytes and a non-full set of bytes, and wherein determining the preliminary CRC on the block of information plus at least one additional byte of information includes:
   initializing the preliminary CRC;
   determining the preliminary CRC on the plurality of sets of bytes; and
   determining the preliminary CRC on the non-full set of bytes plus the at least one additional byte of information.

14. The method of claim 13, wherein each of the at least one additional byte of information has a value of zero.

15. The method of claim 13, wherein initializing the preliminary CRC includes selecting a preliminary value based on a position of a first byte of a first set of the plurality of sets of bytes.

16. The method of claim 13, wherein determining the CRC by a reverse CRC operation on the preliminary CRC includes selecting circuitry or a set of equations based on the number of bytes in the at least one additional byte of information.

17. A method for checking a block of information for a correct cyclic redundancy check (CRC) wherein the block of information includes a plurality of sets of bytes and a non-full set of bytes, the method comprising:
   initializing the preliminary CRC;
   determining the preliminary CRC on the plurality of sets of bytes;
   determining the preliminary CRC on the non-full set of bytes plus the at least one additional byte of information; and
   comparing the determined preliminary CRC with a target value corresponding to a number of bytes of the at least one additional byte of information.

18. The method of claim 17, wherein each of the at least one additional byte of information has a value of zero.

19. The method of claim 17, further comprising retrieving the target value from a lookup table based on the number of bytes of the at least one additional byte of information.

20. A system for determining a cyclic redundancy check (CRC) on a block of information, the system comprising:
   a preliminary CRC generator; and
   a reverse CRC generator coupled to the preliminary CRC generator.

21. The system of claim 20, further including a byte clearing mechanism for setting a portion of a set of bytes operated on by the preliminary CRC generator to zero.

22. The system of claim 21, wherein the reverse CRC generator includes a selection mechanism for selecting circuitry based on a number of bytes set or not set to zero of the bytes operated on by the preliminary CRC generator.

23. The system of claim 20, wherein the reverse CRC generator includes a selection mechanism for selecting a set of operations based on a number of bytes set or not set to zero of the bytes operated on by the preliminary CRC generator.

24. The system of claim 20, wherein the reverse CRC generator includes a selection mechanism for selecting a set of masks based on a number of bytes set or not set to zero of the bytes operated on by the preliminary CRC generator.

25. A system for determining a cyclic redundancy check (CRC) on a block of information, the system comprising:

means for determining a preliminary CRC value on the block of information on at least one additional byte of information; and means for determining the CRC from the preliminary CRC value.

26. The system of claim 25, wherein the means for determining the preliminary CRC value include means for selecting a preliminary value based on a position of a first byte of the block of information.

27. The system of claim 25, wherein the means for determining the CRC from the preliminary CRC value includes means for selecting circuitry or a set of operations based on the number of bytes in the at least one additional byte of information.

\* \* \* \* \*

UNITED STATES PATENT AND TRADEMARK OFFICE
CERTIFICATE OF CORRECTION

PATENT NO. : 6,609,225 B1
DATED : August 19, 2003
INVENTOR(S) : Yu Ng

It is certified that error appears in the above-identified patent and that said Letters Patent is hereby corrected as shown below:

Title page,
Item [56], References Cited, OTHER PUBLICATIONS, insert the following:

-- I.S. REED and REIN TURN, "A Generalization of Shift-Register Sequence Generators," J. of the ACM, Vol. 16. No. 3, July 1969, pp. 461-473.

W. WESLEY PETERSON and E.J. WELDON, JR., ERROR-CORRECTING CODES, Second Edition, Massachusetts Institute of Technology, 1972, pp. 170-268.

"FDDI Media Access Control (MAC-2), ANSI X3T9.5/88-139, July 3, 1992, pp. 1-6.

FRANCE MENDEZ, "VDHL and Cyclic Corrector Codes," Proceedings on the conference on European design automation conference, Grenoble, France, IEEE Computer Society Press, 1994, pp. 526-531.

DAVID C. FELDMEIER, "Fast Software Implementation of Error Detection Codes," IEEE/ACM Transactions on Networking, Vol. 3, No. 6, December 1995, pp. 640-651.

ANNA HAC and XIAOYANG CHU, "A New Cell Loss Recovery Method Using Forward Error Correction in ATM Networks," Int. J. Network Mgmt, Vol. 8, John Wiley & Sons, Ltd, 1998, pp. 87-103.

DILIP V. SARWATE, "Computation of Cyclic Redundancy Checks via Table Look-up," Communications of the ACM, Vol. 31, No. 8, August 1998, pp. 1008-1013.

DOUGLAS E. COMER, COMPUTER NETWORKS AND INTERNETS, Second Edition, Prentice Hall, 1999, pp. 53-69.

LARRY L. PETERSON and BRUCE S. DAVIE, COMPUTER NETWORKS: A SYSTEMS APPROACH, Second Edition, Morgan Kaufman Publishers, 2000, pp. 92-103 and 158-159. --

Signed and Sealed this

Fifteenth Day of February, 2005

JON W. DUDAS
*Director of the United States Patent and Trademark Office*